United States Patent [19]

Roustaei

[11] Patent Number: 5,484,994
[45] Date of Patent: Jan. 16, 1996

[54] OPTICAL SCANNING HEAD WITH IMPROVED RESOLUTION

[76] Inventor: Alexander Roustaei, 1696 Via Inspirar, San Marcos, Calif. 92069

[21] Appl. No.: 137,426

[22] Filed: Oct. 18, 1993

[51] Int. Cl.$^6$ .................................................... G06K 7/10
[52] U.S. Cl. ....................................................... 235/462
[58] Field of Search ................................. 235/462, 472, 235/470, 440, 436, 466

[56] References Cited

U.S. PATENT DOCUMENTS

| | | | |
|---|---|---|---|
| 3,684,866 | 8/1972 | Jones | 235/462 X |
| 4,473,746 | 9/1984 | Edmonds | 235/462 X |
| 4,570,057 | 2/1986 | Chadima, Jr. et al. | 235/472 |
| 4,743,773 | 10/1988 | Katana et al. | 235/472 X |
| 4,818,847 | 4/1989 | Hara et al. | 335/472 |
| 4,900,907 | 2/1990 | Matusima et al. | 235/472 |
| 5,010,241 | 4/1991 | Butterworth | 235/462 |
| 5,073,954 | 12/1991 | Van Tyne et al. | 235/463 |
| 5,135,160 | 8/1992 | Tasaki | 235/462 |
| 5,196,684 | 3/1993 | Lum et al. | 235/462 |
| 5,264,956 | 11/1993 | Tzu-Chin | 235/462 X |
| 5,268,580 | 12/1993 | He | 235/462 X |
| 5,302,812 | 4/1994 | Li et al. | 235/462 |

FOREIGN PATENT DOCUMENTS

| | | | |
|---|---|---|---|
| 2673738 | 9/1992 | France | 235/462 |
| 0035276 | 2/1984 | Japan | 235/462 |
| 0189981 | 8/1988 | Japan | 235/462 |
| 3113581 | 5/1991 | Japan | 235/462 |

OTHER PUBLICATIONS

Data Sheet: CCD Bar Code Scanner; ZB-1000/2000 Plus Series, Zebex Industries, Inc., 1992 Zebex Catalog No. 920802.

Data Sheet: CCD Bar Code Handy Scanner Model BHS-6000 Series; Nippondenso Co., Ltd., Mar. 1992.
Advertisement: "Get a Head with Denso's Reading Edge Technology", ID Systems, Apr. 1987, vol. 7, No. 3.
"Information Encoding with Two-Dimensional Bar Codes", Theo Pavlidis, et al., Computer, vol. 25, No. 6, Jun. 1992, pp. 18-28.

*Primary Examiner*—John Shepperd
*Assistant Examiner*—Jeffrey R. Filipek
*Attorney, Agent, or Firm*—Brown, Martin Haller & McClain

[57] ABSTRACT

The optical scanning head comprises two or more LEDs which are oriented to emit light at different angles so that a fan of light is created. A "dark room" encloses the LEDs, a lens assembly, and the spacing between the lens assembly and the detector, a linear CCD array. The portion of the dark room that extends between the lens assembly and the detector has a plurality of baffles formed therein to capture scattered light, preventing this scattered light from becoming noise at the detector. The lens assembly includes, along with a plurality of focusing lenses, a combination of a generally elliptical aperture, or "cat's eye, and a rectangular obscuration. The combination prevents the central lobe of the Airy disk generated by the incoming light from being transmitted to the detector. This results in the incoming information being carried in the outer lobes or rings, increasing the angular separation of the lines of the bar code. Waveshaping software is incorporated in the decoding processor to compensate for the limitations of the imaging system, which include convolution distortion and the resulting loss of image contrast. This software is used to determine the scan parameters including global threshold for the next scan. As an alternative to use of a global threshold, a sliding frame buffer is used to generate pseudo-pixel numbers to fill in the space between physical pixels in the detector, providing a greater number of effective pixels to obtain better resolution.

19 Claims, 5 Drawing Sheets

OPTICAL SCANNING HEAD WITH IMPROVED RESOLUTION

FIELD OF THE INVENTION

The invention generally relates to an improved scanning system for reading and/or analyzing bar code symbols and more particularly to illumination, optics and decoding for improved resolution of scanned bar code symbols.

BACKGROUND OF THE INVENTION

Many industries, including the assembly processing, grocery and food processing industries, utilize an identification system in which the products are marked with a bar code symbol consisting of a series of lines and spaces of varying widths. A number of different bar code readers and laser scanning systems have been developed to decode the symbol pattern to a multiple digit representation for inventory, production tracking, and for check out or sales purposes. Optical scanners are available in a variety of configurations, some of which are built into a fixed scanning station and others of which are portable. The portability of an optical scanning head provides a number of advantages, including the ability to inventory products on shelves and to track portable items such as files or small equipment. A number of these portable scanning heads incorporate laser diodes which permit the user to scan the bar code symbols at variable distances from the surface on which the bar code is imprinted. A disadvantage of laser scanners is that they are expensive to manufacture.

Another type of bar code scanner which can be incorporated into a portable system uses light emitting diodes (LED) as a light source and charge couple devices (CCD) as detectors. This class of bar code scanners is generally known as "CCD scanners". While conventional CCD scanners have the advantage of being less expensive to manufacture, they limit the user to scanning the bar code by either contacting the surface on which the bar code is imprinted or maintaining a distance of no more than one and one-half inches away from the bar code, which creates a further limitation in that it cannot read a bar code any longer than the window or housing width of the scanning head. Thus, the CCD scanner does not provide the comfort or versatility of the laser scanner which permits variable distance scanning of bar code symbols which may be wider than the window or housing width.

As the use of bar codes for information storage becomes more prevalent, a goal of the optical scanning technology will be to obtain the highest possible bar density in the area that can be scanned in a single "snapshot". Improvements have been disclosed in the present inventor's issued U.S. Pat. Nos. 5,291,009, 5,349,172, and 5,354,977 and co-pending applications, Ser. Nos. 07/843,266, 08/058,951, and 08/059,322, which provide increased depth of field in CCD scanners to allow scanning of larger area symbols. This, in turn, allows more information to be acquired in a single snap shot. However, in order to further optimize the capability of decoding these symbols, it is necessary to ensure that the increased density of the code within a single snap shot does not reduce the scanner's reliability in decoding it.

SUMMARY OF THE INVENTION

It is an advantage of the present invention to provide optics for an optical scanning head for reading high density bar code symbols with increased depth of focus which provide improved resolution for distinguishing individual lines and spaces in the code.

It is another advantage of the present invention to provide a means for processing the data generated by the detector of an optical scanning head to improve resolution and depth of focus and compensate for limitations of the optical system when reading bar code symbols at various distances.

In an exemplary embodiment, the optical scanning head comprises two or more light emitting diodes (LED) which are oriented to emit light at different angles so that a fan of light is created. A diffuser/lens, which includes a cylindrical lens, is positioned in front of each LED to homogenize and focus the LED light to provide a fan-shaped plane of light at the target to illuminate the bar code to be scanned. A slit aperture is disposed immediately in front of the LEDs to eliminate the halo effect that can occur with many types of LEDs. In the preferred embodiment, a pair of LEDs is disposed on either side of an optical module, with a slit for each pair. The slit is oriented so that it "connects" the two LEDs of the pair.

The optical module includes a light shield or "dark room" which encloses the LEDs, a lens assembly, and the spacing between the lens assembly and the detector. The LEDs are isolated from the lens assembly and the detector to avoid stray light from entering the detector. The detector, which is a linear CCD array, detects the intensity of light reflected from the bar code symbol. The portion of the dark room that extends between the lens assembly and the detector has a plurality of baffles formed therein to capture scattered light generated by both the incoming light and by reflections from the front of the detector, preventing this scattered light from becoming noise at the detector. A rectangular light absorbing mask is used to frame the detector to further prevent stray light from entering the detector.

The lens assembly includes, along with a plurality of focusing lenses, a combination of a generally elliptical aperture, or "cat's eye, and a rectangular obscuration, which is positioned so that it is centered in the optical path. The cat's eye, which has a first long axis and a first short axis, is located at the aperture stop within the lens assembly and serves to prevent the central lobe of the Airy disk (the diffraction pattern) generated by the incoming light from being spread to surrounding rings of the Airy disk. The rectangular obscuration has a second long axis and a second short axis and is located on the collecting aperture of the first lens of the assembly, increasing the angular separation of the lines of the bar code. The cat's eye is in the same plane as the bar code, normal to the rectangular obscuration. Except for the improvements described herein, the optical scanner is structurally the same device as that disclosed in the inventor's earlier filed, co-pending applications, Ser. Nos. 07/956,646, 07/965,991, 07/843,266, 08/058,951, and 08/059,322.

In addition to the physical improvements to the optical system to provide improved resolution, the present invention includes a means for shaping the electrical wave pattern produced by the detector representative of the bar code being scanned. Although the waveform produced when a bar code is scanned would ideally be a set of rectangular pulses, the real signal has a rounded form because of the convolution distortion. The waveshaping software compensates for the limitations of the imaging system, which include convolution distortion and the resulting loss of image contrast. Four variables: average optical black code, highest reflectance space code, lowest reflectance space code and highest reflectance bar code, are used to determine the scan parameters consisting of exposure time, negative voltage reference, noise mask, hysteresis, and global threshold for the next scan. As an alternative to use of a global threshold, a second embodiment uses a sliding frame buffer to store pixel code values and pixel numbers from the detector which are then compared with previous pixel values and pixel numbers to determine where edge transitions occur. Pseudo-pixel numbers are generated to fill in the space between physical pixels, providing a greater number of effective pixels to obtain better resolution.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
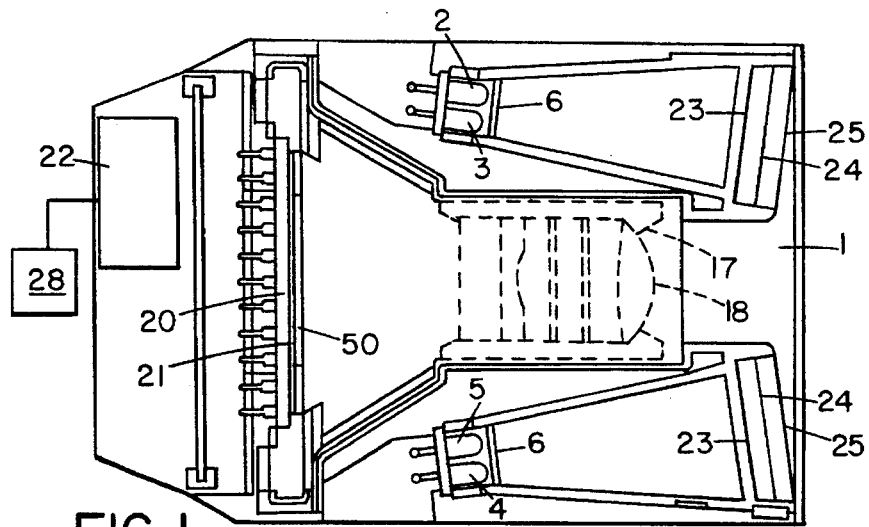
FIG. 1 is a diagrammatic view of the relative layout of the LEDs, optical module and detector on the printed circuit board.

The optical scanning head module illustrated in FIG. 1 comprises the printed circuit board (PCB) 1 onto which is mounted a plurality of light emitting diodes (LEDs) in an orientation that results in projection of a light ray by one LED in a direction distinct from other LEDs. In the preferred embodiment, four LEDs (LEDs 2–5) are used, with two on either side of the optical module. Forward of each of the LED pairs is diffuser/lens 24 which is light transmissive and provides homogenization and focusing of the light path of the illuminating beam incident upon the bar code to be scanned. At the approximate center of board, between the LEDs, is an optical module 17 consisting of a light shield (dark room 16) within which is contained lens assembly 18 which filters and focuses light reflected from a scanned bar code onto CCD detector 20 disposed behind the optical module at the rear of PCB 1. The CCD detector 20 is a linear array and has a protective glass cover 21 over its input area. The lens assembly 18 and detector 20 are both contained within portions of the dark room 16.

A signal generated by activation of the CCDs by the reflected light is conveyed to signal converter 22, which consists of an analog filter and an analog-to-digital circuit. The reflected light carrying the intensity modulated bar code signal is directed back to the lens assembly and to the detector 20. The scanning head may also include a decoder module 28 which decodes a multiple-digit representation of bar code symbols and other code systems which use alternating light and dark regions.

Figure 2:
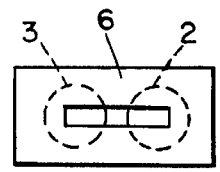
FIG. 2 is a diagrammatic view of an LED pair with its corresponding slit and diffuser/cylindrical lens.

Shown in detail in FIG. 2, each LED of a pair of LEDs 2, 3 and 4, 5 is closely spaced to the other, and may be mounted at slightly different angles with respect to the other to produce a wider beam, i.e., a fan of light. Immediately in front of each LED pair 2, 3 and 4, 5 is a slit aperture 6 which is aligned to span the centers of the LEDs, so that it runs perpendicular to the axis of the bar code, the bar code axis being defined as the direction that a single line in the code runs, e.g., usually running vertically. The purpose of the slit 6 is to reduce or eliminate the halo effect that is produced by many LEDs and to assist in generation of a line of light at the field of view of the scanner. In the prototype version of the invention, the slit is 1.5 mm in width.

The LEDs are selected so that they emit red light within the visible spectrum. The red light provides optimal contrast for bar code scanning applications in which dark and light bars must be distinguished. Infrared light also provides enhanced contrast, so that LEDs emitting light outside of the visible spectrum may be used.

Located in front of the LEDs and slit 6 is combination diffuser/plano-convex cylindrical lens 24 which homogenizes the LED light which is transmitted through the slit 6 using a holographic pattern formed in a thin film (optical coating) on the flat entry side 23 of the lens 24. (In the prototype, the lens 24 is 30 mm in front of the slit 6.) In the prototype, the coating on the diffuser generates a spread of 0.2° (in the y-axis) ×30° (in the x-axis) degree elliptical light shaped diffusion. This homogenized light is then focused by the convex exit side 25 of the lens to produce fan of light which, in turn, creates a line of light at the lens' focus 26.

The combination of LEDs and diffuser/lens 24 is selected to provide maximum collection efficiency and for maximum line density at the bar code target. To minimize the loss of energy from the LED, the LEDs were selected to have a view angle matched to the collection area of the diffuser lens 24. The diffuser/lens 24 is 15 mm wide and 10 mm high. The total included angle of view is $$2 \tan \left[ \frac{7.5 \text{ mm}}{30 \text{ mm}} \right] = 28.072°.$$

Several different LEDs were tested, including the AND155CRP with a 30° angle of view with 1.280 mcd, HP8100 with a 28° angle of view and a similar mcd.

In the prototype scanner, cylindrical lens 24 is acrylic and operates at 637 nm, which is appropriate for the LEDs selected (Hewlett-Packard #HLMP-8100). In order to determine the appropriate lens parameters in the prototype version, the original lens had its entry side 23 initially positioned 23.45 mm from the last surface of the LEDs (the object distance S) and had a focal length (f) of 25.6 mm, imaging the light at 3.5" (88.9 mm) (the image distance S') from exit side 25. According to paraxial ray theory and the Gaussian form of the lens formula:

$$1/f = 1/S + 1/S', \qquad (1)$$

with f and S' being constants of the system, the object distance S was calculated to be 35.0 mm, 11.55 mm greater than the actual distance. Since the space provided for separation of the lens 24 and LEDs is limited by the need to keep the overall scanner compact, this discrepancy led to the designing of a new cylindrical lens 24 with a radius of curvature of 17.06 mm and a focal length of 35.23 mm which is capable of imaging the light at 7" (177.8 mm) from exit side 25.

The LEDs 2–5, the slit 6 and the diffuser/lens 24 are all enclosed within a dark rooms 8 and 9 which can either be separate from or integral with dark room 16 described below. If dark rooms 8 and 9 are formed integrally with dark room 16, as may be convenient for manufacturing purposes, they must be isolated from dark room 16 so that the light from the LEDs does not enter the enclosure surrounding the lens assembly and detector 20.

Figure 7:
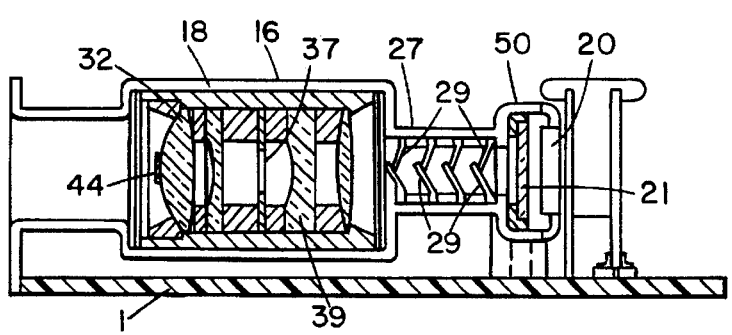
FIG. 7 is a cross-sectional view taken along line 7—7 of FIG. 6.

After the light produced by the LEDs is reflected from the target bar code it is collected by optic module 17 which comprises a number of focusing lenses mounted inside a lens support 30, all of which are retained within dark room 16. Baffle section 27 of dark room 16 extends to cover the space between the lens assembly 18 and the detector 20. The details of baffle section 27 are best shown in FIG. 7, where it can be seen that each baffle 29 runs horizontally with respect to the PCB 2, extending at an angle into the optical axis 32 and in the direction of the incoming reflected light. The use of the dark room baffle section 27 is analogous to a high power laser shingle calorimeter. The concept of the shingle calorimeter is to capture all of the energy that goes into the system. In the case of the baffles in the darkroom, all of the stray, scattered and reflected light from both the incoming signal and the reflections from the glass shield 21 over the detector 20 is captured. The baffle spacing and angle of slant towards the incoming beam allows for capture and subsequent absorption of scattered and stray light coming out of the signal beam. Analysis suggests that the absorption will be complete after three internal reflections off of the baffles 29. Light reflected back from the detector cover glass 21 will strike the baffles 29 at a 75° angle and send the light ray down into the second set of baffles. The angle of the baffles insures that reflected light will ultimately be absorbed in the baffle system and not re-reflected back to the detector 20.

Another feature which cuts down noise at the detector 20 is a light absorptive mask or frame 50 which frames the detector 20 to reduce reflections from the cover glass 21 of the detector. Mask 50 also reduces the possibility of light reflecting at an odd angle off of the baffles 29. Generally, the mask 50 becomes a primary field stop of immediate reflected light from the cover glass 21 and a secondary field stop for any stray light from the baffles 29.

Figure 3:
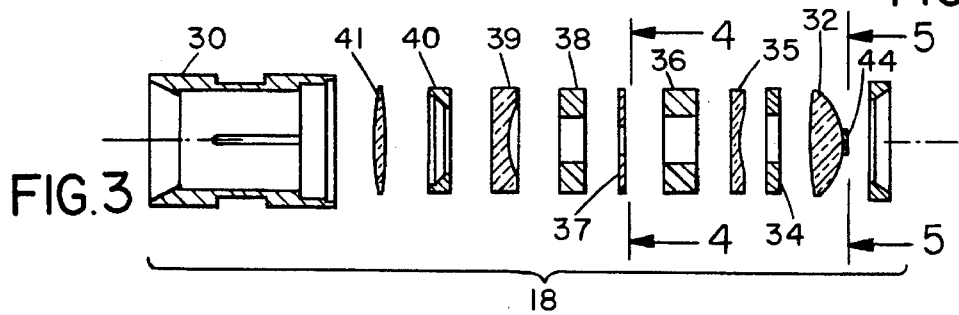
FIG. 3 is an exploded view of the lens assembly.

The selection of the lenses of which the lens assembly 18 is formed depends upon the desired reference plane, i.e., the desired depth of field, which is the distance between the detector 20 and the bar code being scanned, so that the reflected light is appropriately focused on the detector array. The lens assembly 18 of the preferred embodiment, illustrated in FIG. 3, consists of a bi-convex lens 32 followed by a first spacer 34, a bi-concave lens 35, a second spacer 36, an aperture 37, a third spacer 38, a bi-concave lens 39, a fourth spacer 40 and a bi-convex lens 41. Different lens combinations may be used with the object of focusing the incoming beam to provide the maximum useable light at the detector. The procedure for lens selection is within the level of skill in the art. Nonetheless, a guideline for selection of appropriate lenses in provided in co-pending application Ser. No. 08/059,322. The lenses may be coated with an anti-reflection coating and/or a pass-band coating to minimize reflectance at the interfaces between the adjacent lenses and at the ends of the lens assembly and to filter out ambient light which otherwise might become noise at the defector. The lens system may also use an aspherical lens to reduce the number of lenses in the lens assembly 18 to 3 or 2.

Figure 4:
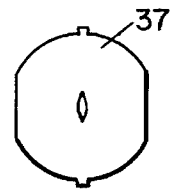
FIG. 4 is a cross-sectional view taken along line 4—4 of FIG. 3 showing the cat's eye aperture.

An important aspect of the present improvement is the "cat's eye" feature of aperture 37, which is a vertically oriented elongated oval, as shown in FIG. 4. The use of the cat's eye is essentially an apodization technique which shapes the central lobe of the Airy disk (the diffraction pattern) to minimize the incoming information, reducing the value of the numerical aperture. The rectangular obscuration increases the angular separation of the lines of the bar code. (The cat's eye is parallel to the individual lines of the bar code, i.e., the axis of the bar code.

Figure 5:
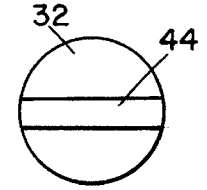
FIG. 5 is a cross-sectional view taken along line 5—5 of FIG. 3 showing the rectangular obscuration.

Working in cooperation with cat's eye aperture 37 is a horizontal blocking mask 44 which is patterned onto the entrance aperture of bi-convex lens 32, as illustrated in FIG. 5. Blocking mask 44 is thin film coated directly onto the lens using techniques that are known in the art. Alternatively, blocking mask 44 can be placed on an optically transparent film, then placed immediately adjacent to lens 32. The blocking mask 44 allows the use of longer spatial frequencies so that the modulation transfer value (MTV) increases substantially at modulation transfer function (MTF) =0.5. The cat's eye aperture 37 provides for an increase in the light for the first bright ring of 2.76, the second bright ring of 4.15 and the third bright ring or Airy disk, of 5.19. That is, the separation goes from $$\frac{0.82\lambda}{N.A.} \text{ to } \frac{0.72\lambda}{N.A.}$$

for the first bright ring and $$\frac{1.33\lambda}{N.A.} \text{ to } \frac{1.23\lambda}{N.A.}$$

for the second bright ring. Third and fourth bright rings follow commensurately. The central obscuration prohibits the integration of the central Airy disk. Thus, the light transmission to the detector 20 is not constant across the aperture, of the lens assembly with the transmission at the center being reduced and the relative amount of light in the surrounding rings being increased.

The analytical model for the cat's eye technique is derived from several components. First is the modification of the MTF of a basically clear aperture system to that of a Cassegrainian system, i.e., where there is central obscuration in the pupil function for the incoming signal. The technique for the cat's eye, however, requires a rectangular obscuration since the bar code is essentially rectangular. The rectangular obscuration must be set normal to the axis of the bar code target. The elliptical aperture at the focus of the lens assembly 18, leading to the image plane, will be set in the same plane as the bar code and normal to the rectangular obscuration on the collection optic, lens 32. The point image intensity distribution t(x,y) will follow from the transfer function $$T(\mu,v) = \int_{-\infty}^{\infty}\int (t(x,y)\, e^{i(\mu x+vy)}dxdy) \quad (2)$$

where $t(x,y)=s(x,y)s*(x,y)$, where $s(x,y)$ is the amplitude distribution.

Equation (2) can now be written as:

$$T(\mu,v) = \int_{-\infty}^{\infty}\int S(\mu_0,v_0)S*(\mu_0-\mu,v_0-v)d\mu_0 dv_0. \quad (3)$$

The transfer function for a diffraction limited system can be evaluated either by a direct Fourier transform of the spread function (Eq. (2)), or by means of a convolution integral of the aperture function with its complex conjugate (Eq. (3)). The second equation offers the advantage of being able to evaluate the wave front characteristics without the complicated detail of the physical diffraction pattern. Nonetheless, the point energy image distribution will be evaluated as a second component of the cat's eye technique.

The following equations are used for evaluating the MTF as a function of frequency:

$$T(\omega) = \{\sqrt{\omega_0(1-\eta^2)}\}\{I_1 + \eta^4 I_2 - 8\eta I_3\} \quad (4)$$

where:

$$I_1 = \int_0^\infty \int_0^{2\pi} [2J_1(R)]^2 e^{i\Omega R\cos\theta}(R)^{-1}d(R)d\theta \quad (5)$$

$$I_2 = \int_0^\infty \int_0^{2\pi} [2J_1(\eta R)]^2 e^{i\Omega/\eta(\eta R)\cos\theta}(\eta R)^{-1}d(\eta R)d\theta \quad (6)$$

$$I_3 = \int_0^\infty \int_0^{2\pi} J_1(R)J_1(\eta R) e^{i\Omega R\cos\theta}(R)^{-1}d(R)d\theta, \quad (7)$$

where $J_1$ = Bessel function of the first order $R = \omega r$, Inserting the proper values, MTF can be evaluated so that $$T(\omega) = \frac{1.0}{1-\eta^2}[A+B+C], \quad (8)$$

where:

for $0 < \frac{\Omega}{2} < 1.0$, $$A = \frac{2}{\pi}\{\cos^{-1}\Omega/2 - \{\Omega/2[\sqrt{1.0-(\Omega/2)^2}\,]\}\};$$

for $\frac{\Omega}{2} > 1.0$ $A = 0$;

for $0 < \frac{\Omega}{2\eta} < 1.0$, $$B = \frac{2\eta}{\pi}\{\cos^{-1}(\Omega/2\eta) - \{\Omega/2\eta[\sqrt{1.0-(\Omega/2\eta)^2}\,]\}\}$$

for $\frac{\Omega}{2\eta} > 1.0$, $B = 0$;

for $0 < \frac{\Omega}{2} < \frac{1.0-\eta}{2}$, $C = -2\eta^2$ for $\frac{1.0-\eta}{2} < \frac{\Omega}{2} < \frac{1.0+\eta}{2}$, $$C = \frac{2\eta}{\pi}\sin\phi + \left(\frac{1.0+\eta}{\pi}\right)\phi - \left(\frac{2(1.0+\eta^2)}{\pi}\right)\tan^{-1}\left\{\left[\frac{1.0+\eta}{1.0-\eta}\right]\tan\phi/2\right\}$$

for $\frac{\Omega}{2} > \frac{1.0+\eta}{2}$, $C = 0$;

$$\phi = \cos^{-1}\frac{1.0+\eta 2-\Omega^2}{2\eta};$$

$$\Omega = \frac{f}{f_0},$$

where $f_0$ = cutoff frequency;

$$\eta = \frac{D_i}{D_0},$$

where $D_i$ = obscuring diameter and $D_0$ = aperture diameter

In the prototype scanner, the collecting lens is 12 mm. The obscuration, blocking mask 44, measures 2.286 mm × 10.88 mm. The resulting effective diameter is:

$$D_e = \frac{4 \cdot 2.286 \cdot 10.88}{2 \cdot 2.286 + 2 \cdot 10.88} \text{ mm} \quad (9)$$

$D_e = 3.7782$ mm and the value for $\eta$ will be:

$$\eta = \frac{3.7782}{12} = 0.31485$$

Using the above equations, MTF can be plotted for the design obscuration. The plot of MTF with lines per millimeter is provided as FIG. 8, with comparative curves provided for no obscuration, curve A, 0.2 obscuration, curve B and obscuration for the calculated value of $\eta$, 0.31485, in curve C. (The optical train NA is 0.1645)

Figure 8:
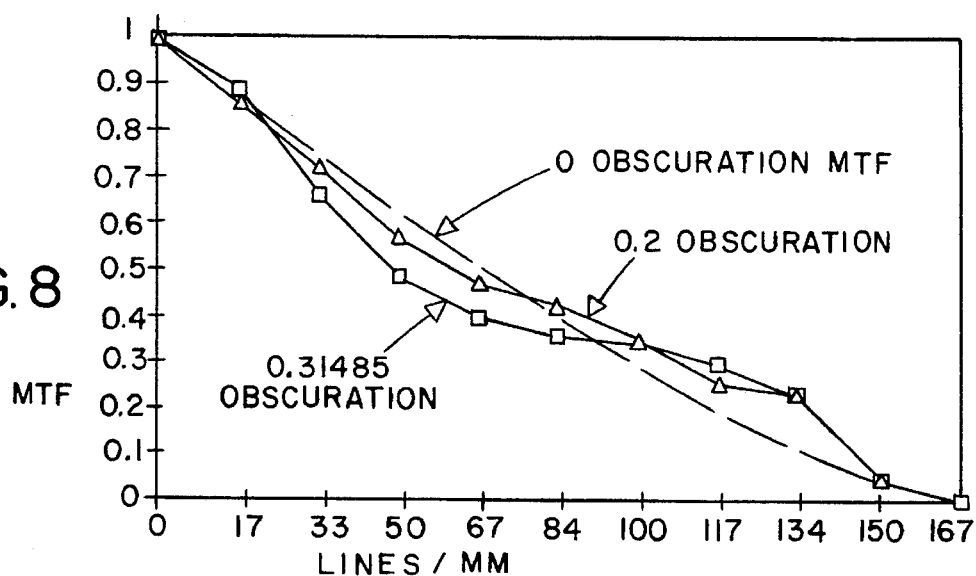
FIG. 8 is a plot of modulation transfer function versus resolution in lines per millimeter.

It can be seen from the FIG. 8 that the obscuration gives substantially higher values at higher frequencies and somewhat lower values at the lower frequencies. This is expected from the equations. Thus, the central obscuration changes the MTF of the optical train rather dramatically and also changes the pupil function in a substantial fashion.

Now looking at the image intensity distribution as it approaches the cat's eye aperture 37, it can be seen that the aperture will provide the contrast ratios that are needed to evaluate the lines and spaces of the bar code. The point intensity will follow from Equation 10.

$$s(r) = 2\pi \int_{\eta\omega o}^{\omega o} [J_o(\omega R)] \omega d\omega, \tag{10}$$

where $J_o$ = Bessel function of zero order, which provides the point image intensity distribution:

$$t(R) = \frac{1}{1-\eta^2} \left\{ \left[ \frac{2J_1(R)}{R} \right]^2 + \eta^4 \left[ \frac{2J_1(\eta R)}{\eta R} \right]^2 - \frac{8\eta J_1(\eta R) J_1(R)}{R^2} \right\}, \tag{11}$$

where:

$R = \omega_o r$;

$\omega_o$ = outer radius of collection optics; and r = radius in aperture,

For the prototype system, the cat's eye 27 has a short axis of 1.0 mm and long axis of 1.875 mm. The relative intensity distribution in the image produced at the detector 20 is plotted in FIG. 9, going from the center of the aperture along the long axis towards its end. This is essentially an evaluation of the amount of energy in the areas that are bounded by the resultant of the two dimensions of the aperture.

Figure 9:
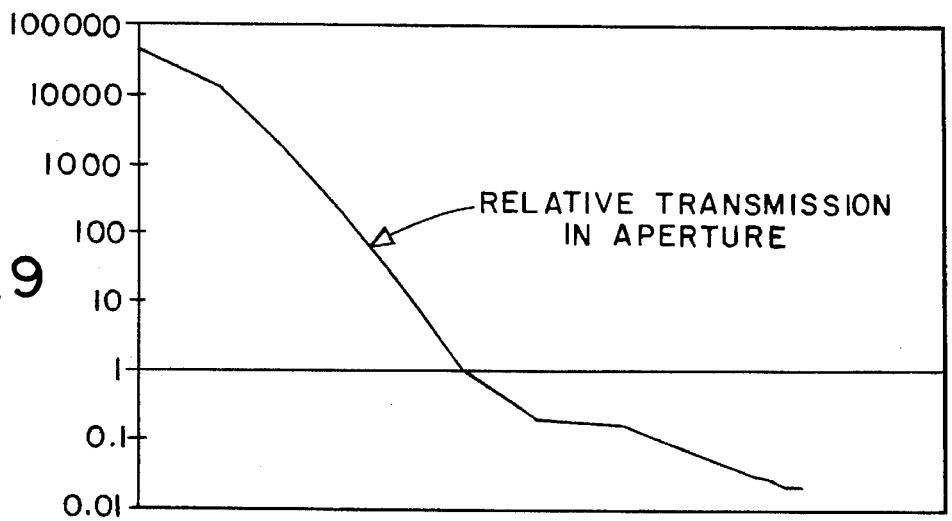
FIG. 9 is a plot of log relative transmission versus aperture height in millimeters.

As seen in FIG. 9, the aspect ratio is large because of the area that is swept out in the progression from the value at 0 to the value at 0.99 mm. Because the change is logarithmic, the contrast between dark and light lines can be controlled as the pupil passes energy from the outer rings of the Airy disk after the center of the Airy disk has been blocked by rectangular mask 44. This obscuration results in little information in the center and does not permit integration of the bar code lines in the center of the detector 20.

Figure 10:
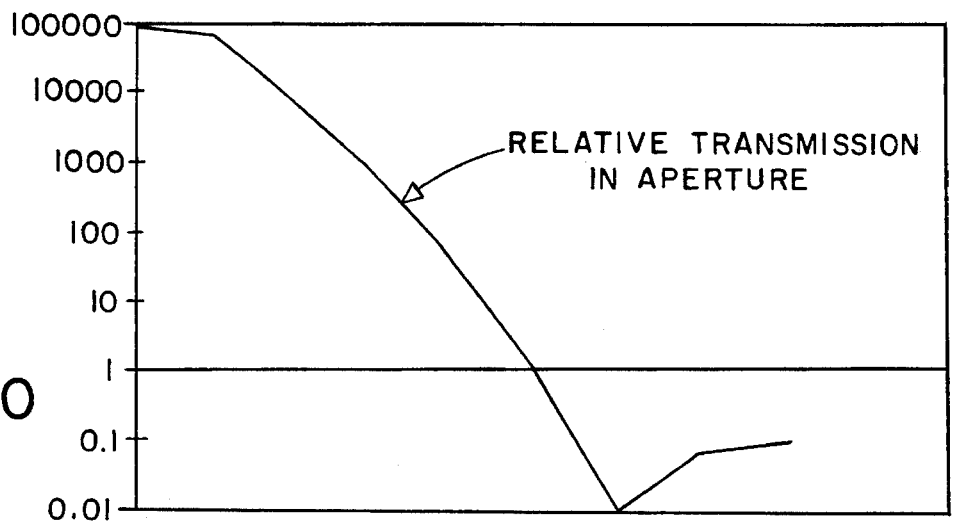
FIG. 10 is a plot of log relative transmission versus aperture width in millimeters.

FIG. 10 is a plot of the transmission through the aperture progressing along the short axis from center to edge, again for light which has already been partially obscured by rectangular mask 44.

It can be seen from the relationship between the obscuration and the cat's eye aperture that they can be closely coordinated. The aperture must have sufficient area to allow the signal strength necessary to read the contrast between the bar codes. The obscuration must be of sufficient dimension to apodize the pupil function and allow for the depth of field in the optical train. However, the mask is not necessary with the cat's eye aperture and the cat's eye can be sufficient to achieve the depth of focus. Also, a similar pupil shaping aperture can be placed elsewhere in the lens system. In the preferred embodiment it is at the aperture stop.

The detector module 20 consists of an array of charged coupled devices (CCD) which are arranged in equally spaced pixels, and may include additional processing elements which are shown in FIG. 16. The spacing of the pixels determines the limit of the resolution of the detector.

The output of the CCD Linear Sensor Array 20 is fed directly into an Analog-to-Digital Converter (ADC) that converts each pixel's analog voltage into an 8-bit binary code. Each code may represent an integer between 0 and 255. The weighting and offset of the code is dynamically adjustable via a software programmed negative voltage reference, implemented as an 8-bit Digital-to-Analog Converter (DAC). To arrive at the absolute voltage for a given pixel, the negative voltage reference offset and the weighting factor of each code must be taken into account. This is only of concern when calculating the new negative voltage reference and global threshold value at the start of each scan.

The waveshaping algorithm implementation uses the relative code values exclusively, and is not concerned with the absolute voltage of the pixels. The source code for the signal processing software is provided along with explanatory comments in Appendix A.

The algorithm operates on the CCD pixel data stream on-the-fly, and does not employ a frame buffer. This realtime aspect precludes the use of traditional image enhancement techniques and necessitated the development of a unique image deconvolution algorithm. The deconvolution algorithm is tightly coupled with the noise filtering algorithm, making it difficult to describe the actual implementation. The following description will present a background on the functioning of the algorithm by way of example image waveform data and its interpretation by the waveshaping software.

The waveshaping software must accommodate and compensate for the limitations of the imaging system. The primary function of the waveshaping software is to compensate for convolution distortion and the consequent loss of image contrast.

There are three contributing factors to the convolution distortion: collection optics focus and MTF characteristics, contrast of the target, and quantization error introduced by the CCD sensor array. The image may also be degraded by unevenness of illumination and/or reflectance.

The FIGS. 11–14 and 16 are exemplary plots using the integer codes assigned to the pixels by the ADC, i.e., the pixel numbers. The pixel numbers are distinct from reference numerals used in the previous figures, and represent the actual quantity and relative location of pixels in the CCD array.

Figure 11:
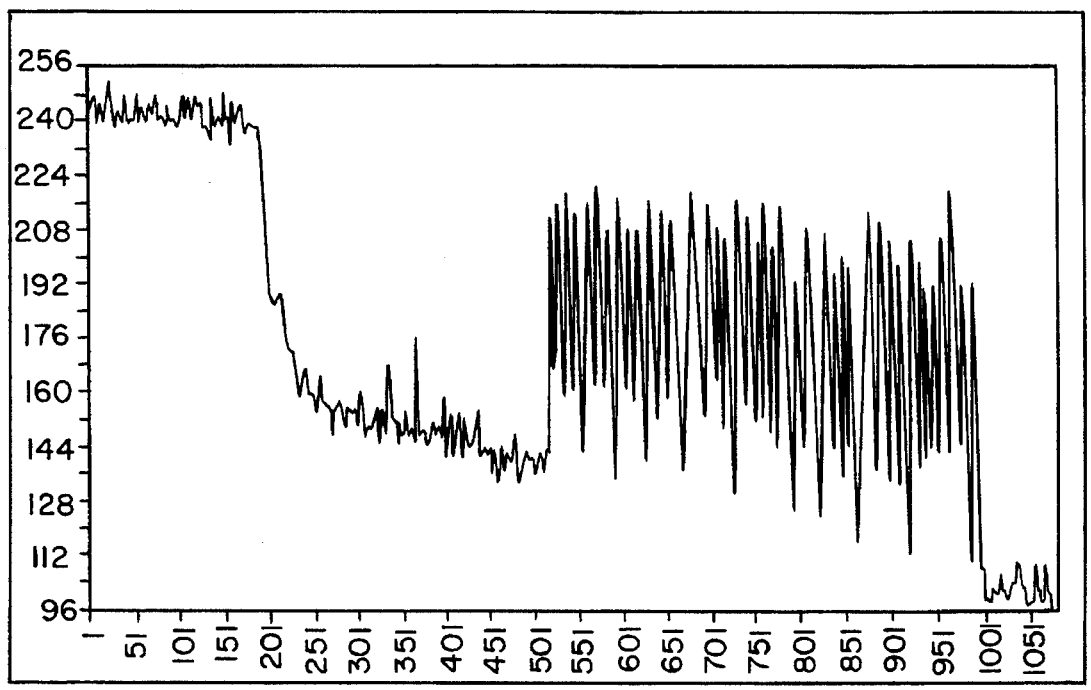
FIG. 11 is a plot of pixel values for a bar code scan.

FIG. 11 shows a vector plot of the pixel codes captured from a scan of a 6 mil bar code. As can be seen, the image is on a slight gradient and there is less than ideal contrast between the bars and spaces. Also, evidently there is significant noise in the signal, as can be seen within the quiet zones on either side of the bar code.

Figure 12:
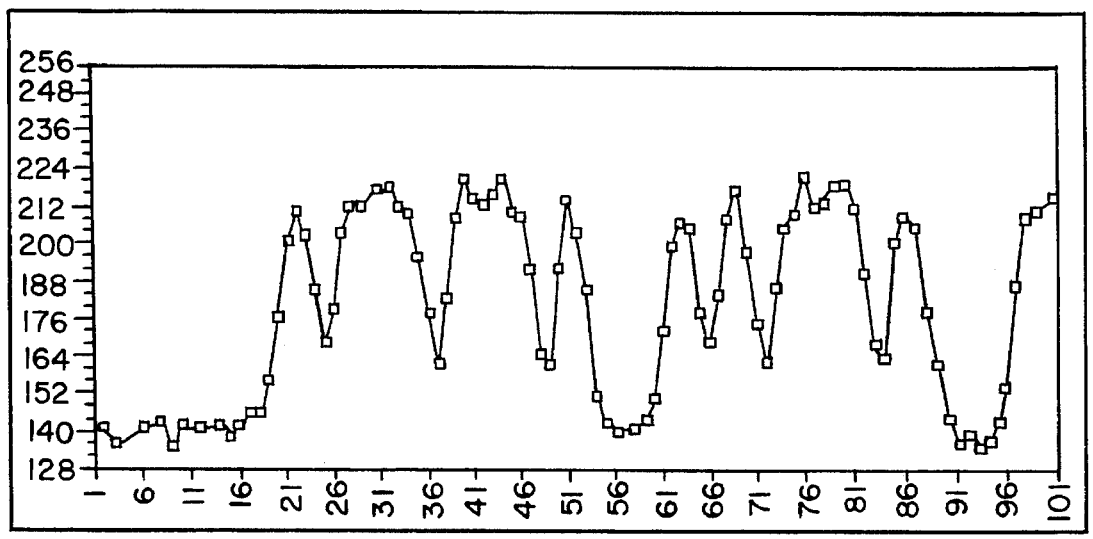
FIG. 12 is a detailed plot of pixel values for the first nine bars of the bar code scan of FIG. 11.

FIG. 12 shows only the first 9 bars of the bar code image. Each square in the graph corresponds to a pixel code. This graph clearly demonstrates the convolution distortion caused by the pixelization process, where a quantization error is introduced because the sample rate (number of picture elements per inch) is less than ideal for the fine pitch bar code.

In FIG. 12 the contrast loss due to less than perfect focus can be observed. Each peak in the graph corresponds to the center of a bar. Each trough corresponds to the center of a space in the bar code. Pixels 1 through 18 correspond to a quiet zone of high reflectance. Pixels 19 through 24 correspond to the first bar of the bar code, an area of low reflectance, with pixel 22 being the peak of the positive excursion. Pixel 25 is the bottom of the trough of the negative excursion. The bottom of the trough at pixel 25 has a code value of 168, yet it can be seen that the trough at pixel 57 has a code of 141. The original printed bar code had equal reflectance at these two points, but the convolution distortion has introduced this error of 27 codes between these two points.

There is a peak code of 222 at pixel 76, immediately followed by a trough of 211, a difference of 11 codes. The software must filter this noise while concurrently detecting slope direction changes in order to track the peaks and troughs of the wave form.

Waveshaping Software Overview

The waveshaping software consists of two major sections, the realtime scan processing software and the pre-scan setup software. The realtime scan processing software dynamically adjusts 8 variables while processing a scan. The pre-scan software dynamically adjusts 5 variables in between scans.

The scan processing software uses four variables to track the state of the waveshaping logic:
1. Current Pixel code
2. Previous Pixel code
3. Peak Previous Pixel code
4. History bits variable that tracks the slope direction and current slope transition trend. The history bits consists of four bits. Bit 0 corresponds to the slope direction of the current pixel. Bit 1 corresponds to the slope direction of the previous pixel. Bit 2 corresponds to the previous established slope. Bit 3 is used as a state bit that indicates that the hysteresis test has already passed, so that hysteresis margin testing is only performed once. Bit 0 and 1 are used to detect a slope transition trend, and bit 2 contains the state of the previous established slope trend.

The software also keeps track of the current pixel number being processed by using a 16-bit counter that is initialized to the total number of pixels to be processed. The pixel count is decremented for each pixel processed, and when zero, the scan processing loop is exited. A push-down stack of 16-bit values is maintained. Each stack entry contains the contents of the pixel counter at which the Laser Data emulation output bit was toggled. This buffer is used for Reverse Scan Emulation and for decoding configuration bar codes. Nothing precludes the use of this buffer for decoding other bar code symbologies. In fact, the contents of this buffer should provide a higher resolution quantization than traditional bar code decoders that use a timer to assign time values to the bar code edges.

During each scan the value of four variables are determined, which are subsequently used to calculate the pre-scan variables:
1. Average Optical Black code
2. Highest reflectance space code—Peak White
3. Lowest reflectance space code Low White
4. Highest reflectance bar code—Low Black The pre-scan software uses these four variables to determine the exposure time, negative voltage reference, noise mask, hysteresis, and global threshold for the next scan.

Scan Processing Software

The top of the scan processing decrements the pixel counter and exits the processing loop when the pixel counter reaches 0. The next pixel is read in when the CCD timing generator clocks in the next ADC sample into the microcontroller H8/325's parallel port. The current pixel's code value is compared to the Peak White value. If the current pixel is less than the Peak White value, the Peak White is set to the current pixel's value.

The first stage noise filtering is accomplished by comparing the current pixel's code from the previous pixel's code. If the absolute difference between the two values is less than the Noise Mask, it is assumed the current pixel has the equivalent value of the previous pixel, and no change is made to the LSB of the history bits because the LSB will already be the same as the second bit. If the difference exceeds the Noise Mask, it is determined if the current pixel is either greater than or less than the previous pixel's value. The least significant history bit is set based upon the sign of the result. If the current pixel is of a lower code value than the previous pixel, the LSB is cleared of the history bits. If the current pixel is of a higher code value than the previous pixel the LSB of the history bits is set.

If the Noise Mask made the current pixel equivalent to the previous pixel, an additional test is performed to compensate for the fact that some large pitch bar codes could produce such a gradual slope that the slope direction changes could be entirely filtered out by the Noise Mask. The current pixel code is subtracted from the Peak Previous Pixel code and the absolute difference is checked against the Hysteresis value. If the absolute difference exceeds the Hysteresis value, then the LSB of the history bits is set or cleared based upon whether the current pixel value is either less than or greater than the Peak Previous Pixel. Bit 3 of the history bits is also set to indicate the current pixel has already passed the hysteresis test.

Processing then continues based upon the contents of the history bits variable. One of 16 possible state handlers will then be executed.

STATE 0000 and STATE 1000:

No change in slope detected. History bits set to 0000. If the Previous Pixel is less than the Peak Previous Pixel, then set the Peak Previous Pixel to the Previous Pixel value. Set Previous Pixel to current pixel value.

STATE 0001 and STATE 1001:

The current pixel is darker than the previous pixel. May be the start of a slope transition trend. Set history bits to 0010. If the Previous Pixel is less than the Peak Previous Pixel, then set the Peak Previous Pixel to the Previous Pixel value. Set Previous Pixel to current pixel value.

STATE 0010 and STATE 1010:

The previous pixel was darker than the Peak Previous Pixel, but the current pixel is lighter than the previous pixel. It is assumed that a single pixel noise hit has occurred. Set history bits to 0000. If the Previous Pixel is less than the Peak Previous Pixel, then set the Peak Previous Pixel to the Previous Pixel value. Set Previous Pixel to current pixel value.

STATE 0011:

Both the Previous Pixel and the current pixel are darker than the Peak Previous Pixel. A possible slope transition has been detected. The slope transition is justified by comparing the current pixel with the Peak Previous Pixel. If the absolute difference between the Peak Previous Pixel and the current pixel is less than the Hysteresis value, then a valid slope transition has not been detected and the history bits will be set to 0010. If the Previous Pixel is less than the Peak Previous Pixel, then set the Peak Previous Pixel to the Previous Pixel value. Set Previous Pixel to current pixel value. If the Hysteresis check is successful, a valid slope transition has been detected and the history bits will be set to 0111. If the Peak Previous Pixel is greater than the Low White value and the Peak Previous value is less than the Low Black value, the Low White value to the Peak Previous Pixel is set. The Peak Previous Pixel is then set to the value of the Previous Pixel. The Previous Pixel is set to the value of the current pixel.

STATE 0100:

Both the Previous Pixel and the current pixel are lighter than the Peak Previous Pixel. A possible slope transition has been detected. The slope transition is qualified by comparing the current pixel with the Peak Previous Pixel. If the absolute difference between the Peak Previous Pixel and the current pixel is less than the Hysteresis value, then a valid slope transition has not been detected and the history bits will be set to 0101. If the Previous Pixel is greater than the Peak Previous Pixel, then set The Peak Previous Pixel to the Previous Pixel value. Set Previous Pixel to current pixel value. If the Hysteresis check is successful, a valid slope transition has been detected and the history bits will be set to 0000. If the Peak Previous Pixel is less than the Low Black value and the Peak Previous value is greater than the Low White value, the Low Black value is set to the Peak Previous Pixel. The Peak Previous Pixel is then set to the value of the Previous Pixel. The Previous Pixel is set to the value of the current pixel.

STATE 0101 and STATE 1101:

The previous pixel was lighter than the Peak Previous Pixel, but the current pixel is darker than the previous pixel. It is assumed that a single pixel noise hit has occurred. Set history bits to 0111. If the Previous Pixel is greater than the Peak Previous Pixel, then set the Peak Previous Pixel to the Previous Pixel value. Set Previous Pixel to current pixel value.

STATE 0110 and STATE 1110:

The current pixel is lighter than the previous pixel. May be the start of a slope transition trend. Set history bits to 0100. If the Previous Pixel is greater than the Peak Previous Pixel, then set the Peak Previous Pixel to the Previous Pixel value. Set Previous Pixel to current pixel value.

STATE 0111 and STATE 1111:

No change in slope detected. History bits set to 0000. If the Previous Pixel is greater than the Peak Previous Pixel, then set the Peak Previous Pixel to the Previous Pixel value. Set Previous Pixel to current pixel value.

STATE 1011:

Same as state 0011, except hysteresis check is not performed.

STATE 1100:

Same as state 0100, except hysteresis check is not performed. There are two possible methods for edge reconstruction.

First Edge Reconstruction Method

After the general state processing has been completed, we next perform the global threshold check to determine if the slope has crossed the global threshold, indicating the time has arrived to actually toggle the Laser Emulation data output bit. Note that the threshold check is only performed for the slope direction currently indicated by bit 2 of the history bits variable: 1 = getting darker, 0 = getting lighter. If the current slope is decreasing in value (getting lighter), and the current pixel is less than the global threshold, and the current state of the Laser Emulation data bit is not indicating a space, then the current pixel number is pushed onto the bar code transition stack and the changing of the Laser Emulation data bit is scheduled to be set to indicate a space when the next pixel sample becomes ready. If the current slope is increasing in value (getting darker), and the current pixel is greater than the global threshold, and the current state of the Laser Emulation data bit is not indicating a bar, then the current pixel number is pushed onto the bar code transition stack and the changing of the Laser Emulation data bit is scheduled to be set to indicate a bar when the next pixel sample becomes ready. The changing of the Laser Emulation data bit to the CCD timing generator is synchronized to minimize edge timing variations due to processing overhead. Edge transitions are therefore consistent to within a few hundred nanoseconds of a pixel time.

Figure 13:
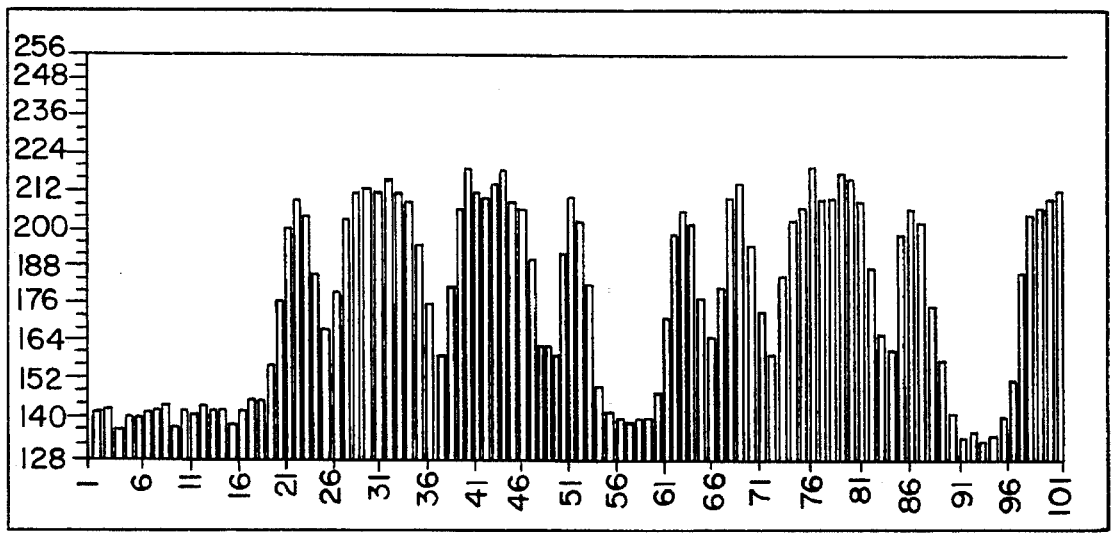
FIG. 13 is a bar chart of pixel values.

FIG. 13 shows a bar chart of the values of the pixels for the first 9 bars of a 6 mil bar code.

Figure 14:
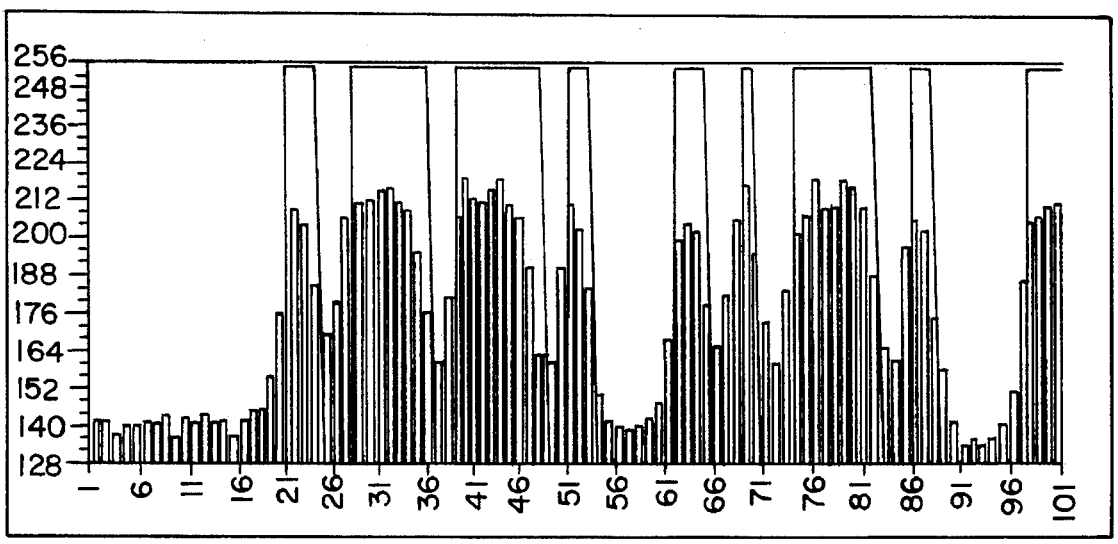
FIG. 14 is a bar chart of pixel values comparing the result of the first waveshaping method with the pixel values of FIG. 13.
Figure 15:
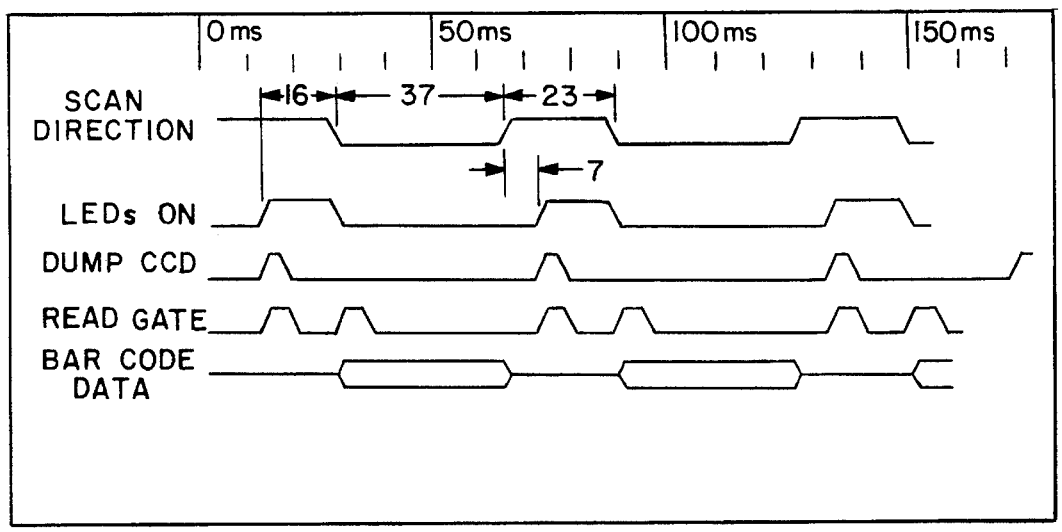
FIG. 15 is a diagram of simulated electronic shutter timing for exposure control.

The first waveshaping edge reconstruction technique emits Laser Emulation data bit transitions in real time and stores the pixel number where the edge transition was emitted on the bar code transitions stack, in response to the detection of a pixel that has crossed the global threshold. FIG. 14 superimposes the Laser Emulation data bit state over the bar chart from FIG. 13. The software that processed the data had a Noise Mask value of 17 and a Hysteresis value of 33. The current version of the software uses a fixed Noise Mask of 1 and a fixed Hysteresis value of 3. The calculated global threshold was set at 179. As can be seen, a number of factors have introduced some moderate edge timing distortions into the reconstructed bar code edges, most significant of which is the quantization error introduced by the pixelization process. Even if an ideal global threshold is used along with an ideal image with no exposure gradient, the quantization error introduced by the CCD elements will cause significant edge timing distortions.

Second Edge Reconstruction Method

This last step, the global threshold check and transition detection, are replaced if the modified frame buffer technique of the second method is implemented. The modified frame buffer technique is implemented as follows:

A sliding frame buffer is implemented as a FIFO queue, of, e.g., 16 elements. Each queue element would contain the pixel code value and the pixel number. A queue head pointer and a queue tail pointer would be maintained, along with a count of the number of queue entries.

When a slope direction transition is detected and successfully qualified, the Peak Previous Pixel value (extreme point of the previous direction) would be saved as the Previous Slope Peak, along with the Pixel number of the Previous Slope Peak. When the Peak Previous Pixel is updated, a Peak Previous Pixel Number will be updated, to track the pixel number of the peak value. At the time that the Peak Previous Pixel is updated, a new mean value between the current Peak Previous Pixel and the Previous Slope Peak is calculated. If the count of queue entries is greater than 1, the value stored at the tail of the queue + 1 will be compared to see if the value is less than or greater than the calculated mean value, depending on the current slope direction. If the mean value is not exceeded, the tail pointer will be moved forward and the queue count will be decremented. Prior to updating the Peak Previous Pixel with a new value, the previous value will be saved along with the previous value's pixel number. After the tail pointer update has been done, on attempt to store the saved peak previous info onto the head of the queue will be made. If the queue capacity would be exceeded, the saved previous value just overwrites the value at the head of the queue.

When the next slope direction transition is detected and qualified, the mean value between the Previous Slope Peak and the current Peak Previous Pixel is calculated. A forward search in the queue is done to look for the first value in the queue that exceeds or matches the mean value. If an exact match of the mean value is found, no further processing is necessary. However, if an exact match is not found, the pixel information for the pixel in the queue that exceeds the mean value is compared with the pixel information in the queue element immediately before the exceeding pixel. At this point there will be two pixel numbers and two pixel values of interest. The mean pixel value will fall between the two pixels found in the queue. A pseudo pixel number that falls between the two physical pixels in the queue is calculated.

To calculate the pixel numbers where the edge transitions should occur, the pixel number is expanded to consist of a 10-bit integer portion and a 4-bit fractional pixel portion. This has the effect of creating 16,384 effective pixels from the 1024 physical pixels found in the CCD sensor.

This technique will more accurately reconstruct the bar code edges, compensating for the quantization error by providing 16 times more effective pixels. Also, all dependencies on a global threshold will be eliminated. This has the desirable effect of allowing reconstruction of bar code edges when the image reflectance or and/or illumination is on an extreme gradient, as well as adding some immunity to specular reflection. In the current implementation, a specular reflection off the surface being imaged results in a sampling of pixels that may appear to be in saturation or close to saturation, giving a Peak White value that indicates that exposure and/or the sensitivity of the ADC must be reduced. When the sensitivity of the ADC and/or the exposure time is reduced, the dynamic range for the codes from the portion of the bar code image we may be interested in is compressed, making it nearly impossible to detect when a pixel value passes through a global threshold value. Eliminating the entire thresholding aspect of the waveshaping software will greatly improve the performance of the optical scanning head when imaging bar codes that have gradient and specular reflection problems.

For accurate image reconstruction, the collection optics must still magnify the image sufficiently so that the smallest bar or space covers 2.5 physical pixels on the CCD sensor.

This new technique is not without some drawbacks. The number one drawback is that this technique precludes emitting the Laser Emulation bar code transition edges in real time. This technique will fill up the bar code transition buffer with the effective pixel numbers of the transitions, but now a post process must emit the transitions on the Laser Emulation interface. This poses no problem if the decode function is implemented within the microcontroller H8/325 and then translate the data to wand emulation, PC keyboard emulation, RS-232, or POS emulation. But, Laser Emulation poses the problem of emitting enough scans per second to allow a quick decode by a third party external decoder. We could possibly compensate for this by emitting multiple forward and reverse scans during our inter-scan period, but no data would be output during the CCD readout period. The best solution would be to split the waveshaping function out into a separate logic sequencer implemented as an ASIC. The microcontroller H8/325 could then either continuously emit Laser Emulation data, or just directly decode the bar code from the bar code transition buffer, depending on the operating mode of the optical scanning head. This solution would potentially permit greater than 200 scans per second to be accomplished, if the CCD's maximum clock rate is high enough.

Pre-Scan Setup Software

The pre-scan setup software prepares the exposure time, negative reference voltage, noise mask, hysteresis, and global threshold parameters for the next scan based upon the value of variables determined during the preceding scan.

The software evaluates the Peak White code to determine if the exposure time and/or the negative reference voltage code need to be adjusted for the next scan. The mean of the Low White and Low Black codes is used as the threshold code for the next scan. The average optical black code is used to determine the relative adjustment factor for the negative voltage reference and global threshold when adjusting the exposure time. The Noise Mask and Hysteresis values are determined by a table lookup based upon the negative reference voltage code.

First Parameter Adjustment Technique

If the Turbo Scan Bit is not set, the free running timer is started counting to time how long it takes to compute the new parameters for the next scan. This is done so that a subsequent precise delay until the time when we must start our next exposure can be programmed, so that the reverse scan period remains fixed and does not vary due to processing delays. NOTE: When reverse scan emulation is enabled, the reverse scan period will vary due to the quantity and spacing of bar code transitions being played back from the bar code transitions buffer.

If the Low White value is 0, then set the Low White value to the Peak White Value and the Low Black value to the average optical black value. The mean of the Low White and Low Black values is calculated.

The absolute voltage level of the Peak White code is then calculated. First, the absolute voltage of the negative reference voltage is calculated by multiplying the negative reference voltage code by 193, for 19.3 millivolts per code. The result is the absolute voltage level of the DAC in tenths of millivolts. This value represents the offset voltage. The offset voltage is subtracted from the known positive reference voltage, which is 49,860—again in tenths of millivolts. The result is the relative range of voltages that may be represented by the 256 possible codes that the ADC may produce. Dividing this number by 256 gives us the tenths of millivolts per ADC code. To find the absolute Peak White voltage the Peak White value is multiplied by the ADC volts-per-code and then add the negative reference voltage offset is added.

If the Peak White code is 0, ADC under flow occurred, and the negative reference voltage and/or the exposure time will be adjusted, if possible. If the negative reference voltage code is less than or equal to the Minimum Vref Code (a constant corresponding to a DAC negative reference voltage that is above the CCD's Vsat voltage), an attempt will be made to shorten the exposure time. Otherwise, the negative reference voltage code is set to the predefined minimum value and the exposure is not adjusted.

If the exposure must be shortened, the current exposure setting is first checked. If the current exposure setting is already set to the minimum exposure, then no exposure adjustment is performed. Otherwise the exposure time is changed to half of the exposure time that was used for the previous scan. Since half as much light will be accumulated by the CCD, the negative reference voltage and threshold are adjusted accordingly. The negative reference voltage for the next scan will be based upon the Peak White absolute voltage, so the Peak White absolute voltage is adjusted. First, the absolute voltage of the average Optical Black code is calculated. The average Optical Black code was calculated during the preamble to the previous scan. The codes were summed for the 16 optical black pixels and then the sum was divided by 16 to arrive at the average Optical Black code. To calculate the absolute voltage of the average Optical Black code, the average Optical Black code is multiplied by the Volts-per-Code value calculated previously, and the absolute voltage Of the negative reference voltage is added. This average Optical Black absolute voltage is taken and the Peak White absolute voltage subtracted from it. The result is divided by 2, because the difference between Optical Black and the Peak White voltage should be halved when the exposure is reduced by half. The new difference from the Optical Black absolute voltage is subtracted to arrive at the new Peak White absolute voltage.

Next the Threshold code for the new exposure setting is adjusted. The current implementation is written for the ILX503/505/703 type of CCD, and must be rewritten for optimum performance with the ILX511. The prototype optical scanning head design used a technique called correlated double-sampling, where the pre-charge of the CCD output stage was sampled, and then the CCD pixel value was sampled. The pixel value was subtracted from the pre-charge value, and the 1's complement result was then used as the relative code value. This technique minimizes the low frequency noise feed-through, but made it impossible to calculate the actual absolute voltage of a pixel. The Peak White pixel was always compared and saved using the actual pixel code, prior to applying the pre-charge correlation. But, the Threshold code value was a relative value, and could therefore only be adjusted against the average Optical Black code. The Threshold code is subtracted from the Optical Black code, the result divided by two, and the quotient is subtracted from the Optical Black value once more to arrive at the new Threshold code.

If the absolute peak white voltage is less than the minimum peak white voltage (calculated to be at a voltage somewhere below the Vdark voltage of the CCD), an attempt will be made to increase the exposure time if the exposure time is not already the maximum of 1/60th of a second. New values must be calculated for the Peak White absolute voltage and the Threshold code in a similar fashion to the procedure used previously to the exposure in half, except that the exposure will be doubled, accumulating light for twice as long, so that the differences will be multiplied by 2 instead of dividing.

After exposure compensation has been determined, preparation is made to start the exposure. If the Turbo scan bit is set, the next exposure is started immediately. Otherwise, a timer is set to defer the start of the exposure until the fixed reverse scan period has elapsed. The contents of the Free Running Timer is read, which is the elapsed time used to perform the exposure compensation calculation, and that value is subtracted from the fixed reverse scan period time constant. The exposure time is subtracted from the remaining time value to arrive at the delay that will be programmed. If the delay is less than or equal to zero, the next exposure is immediately started, otherwise, the timer interrupt service routine is prepared to run a routine that will start the exposure when the delay elapses.

Finally, the DAC code for the negative reference voltage is calculated. The negative reference voltage code is determined based upon the Peak White absolute voltage. The Peak White absolute voltage is simply divided by 193 (for 19.3 millivolts per code) to arrive at the new negative reference code.

The negative reference code is used to perform a table lookup of the new hysteresis and noise mask values. The negative reference code is used as an index into each table to locate the new hysteresis and noise mask values.

No adjustment is made to compensate the Threshold code, because the Threshold code is only a relative value.

Second Parameter Adjustment Technique

The following changes may be necessary to optimize the operation of the optical scanning head for the ILX511 CCD.

The optical scanning head will expect the output of the CCD to be between 0.8 volts and 2.5 volts. The positive reference voltage will be provided by a precision band-gap 2.5 V reference. Therefore, all the constants associated with the reference voltage and the CCD parameters must change. The new parameters will be selected empirically, by fully characterizing the operation of the new hardware.

The new design may potentially introduce more noise in the CCD sensor's output, so the contents of both the Hysteresis and Noise Mask lookup tables may need to be adjusted for optimum operation.

If the CCD does not have an option of using an external reset input to clear the output stage of the CCD, so there can be no output stage precharge sampling, and consequently, no correlated double-sampling. All code that processed the correlated double sampling will be removed. As a consolation, it now becomes possible to determine the absolute voltage of the Threshold code, allowing accurate adjustment of the Threshold code concomitant with the adjustment of the negative reference code. This should reduce the time it takes the optical scanning head to zero in on the optimum parameters for a new target to as little as a single scan. The first scan would set the appropriate parameters for exposure, negative reference, Noise Mask, and Threshold, and the second and subsequent scans would emit the accurate reconstruction of the bar code.

The calculated Threshold will now be converted into an absolute voltage for adjustment by the exposure adjustment code. New code will be added at the end of the routine to convert the absolute voltage threshold into the corresponding code based upon the adjusted negative reference voltage. The following procedure would be followed: the ADC Volts-per-Code must be determined based upon the new negative reference offset. The negative reference offset voltage is subtracted from the known positive reference voltage, which will be 21,200, in tenths of millivolts. The result is the relative range of voltages that may be represented by the 256 possible codes that the ADC may produce. Dividing this number by 256 gives the tenths of millivolts per ADC code, or the Volts-per-Code value. The Threshold absolute voltage minus the offset voltage is divided by the Volts-per-Code to arrive at the new Threshold code value.

The prototype optical scanning head had a fixed clock divisor of either 11, for normal readout and pixel processing, or 4, for simulating an electronic shutter by dumping the CCD contents. With a divide by 4 clock, the CCD can be dumped in 1/500th of a second. A subsequent version of the optical scanning head using the ILX511 has a programmable divide-by-N clock divisor, allowing the selection of divide by 1 to divide by 16. The software will be modified to program the optimum CCD clock rate for both the CCD readout and pixel processing mode and the CCD dump mode. If the ILX511 can operate at close to 5 MHz, it should be possible to achieve a 1/1000th exposure time, permitting the optical scanning head to operate in bright sunlight.

The illumination LED's are modulated on-and-off at 1 KHz, where the LED'S are on for 162 microseconds and then off for 840 microseconds. To guarantee consistent exposure characteristics, the LED PWM oscillator is always restarted immediately prior to starting an exposure. Both the pulse rate and the duty cycle of the LED'S could be dynamically adjusted, but just reducing the overall exposure time, and therefore the LED cumulative on time, seems to be sufficient. The default Power Saver option only enables the LEDs when the CCD is accumulating an exposure, making it appear that the LEDs are 'pulsing' at 16 times a second. When the Power Saver mode is disabled, the LED's appear to remain on continuously. In both cases, the LED's are cycling on and off at 1000 times a second. The visible 'pulsing' effect is a result of the fact that the CCD exposure time (LED enable time) is substantially less time than the CCD readout time.

Reverse Scan Emulation Software

After each scan and pre-scan setup and parameter adjustment, a routine is called which examines the bar code edge transitions buffer to determine if a valid configuration menu programming bar code has been scanned. If a valid configuration menu bar code is detected, no reverse scan emulation will be performed, and the software will simply wait until the Laser Enable signal negates.

If the Reverse Scan Emulation option bit is set, and the optical scanning head mode select bits indicate Laser Emulation Mode, and there are greater than 4 bar code edge transitions in the bar code edge transition buffer, then the Reverse Emulation operation is performed.

Reverse Scan Emulation simply 'plays back' the bar code edge transitions on the Laser Emulation interface data output bit. The contents of the bar code edge transitions buffer in Last-In-First-Out order are played back, causing a mirror image reverse scan of the bar code to be emulated. The play back is done in compressed time, where each pixel time is compressed by a factor of 4.

During the real time forward scan, each pixel takes approximately 17.9 microseconds to be processed. During the compressed time emulated reverse scan, the edge transitions are played back with a simulated pixel time of 4.4 microseconds per pixel. The second to last pixel number is subtracted from the last pixel number on the stack of bar code edge transitions. The result is the number of pixels between the two bar code edges. A delay is initiated at the rate of 4.4 microseconds per pixel. When the delay count of pixels has elapsed, a bar code edge transition on the Laser Emulation data output is emitted and an index which points to the end of the buffer is decremented. This process is repeated until the index becomes 0.

CCD Electronic Shutter Software

An electronic shutter function is implemented to allow exposure control independent of the scan rate. The maximum scan rate is determined by the pixel clock to the CCD, which determines the time it takes to clock out the 2048 real pixels, 18 optical black pixels and 20 dummy pixels (total of 2086). The maximum pixel clock frequency is constrained by the worst case processing time of a single pixel. In the current software, this is approximately 17.6 microseconds. The closest clock rate that can be derived from the CPU's system clock is 55.854 KHz, giving a total scan time of 37.4 milliseconds. Without the simulated electronic shutter, light would be allowed to accumulate for 37.4 milliseconds for each scan, or 1/27th of a second, which is much too slow to stop the blurring of the image caused by normal human shake and vibration.

Figure 6:
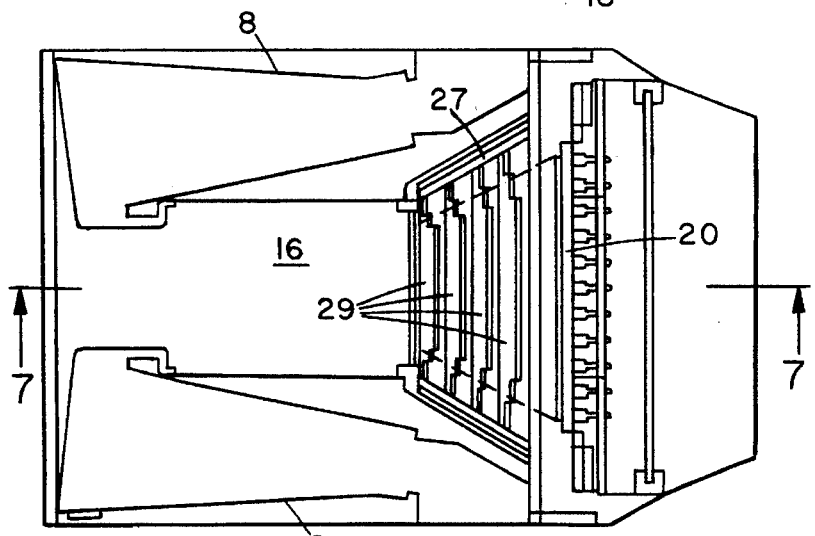
FIG. 6 is a diagrammatic view of the dark room assembly and baffles as mounted on the printed circuit board.

To simulate an electronic shutter, the contents of the CCD must be dumped two times for each scan processed. FIG. 6 is a simplified timing diagram which shows the two CCD Read Gates for each data readout from the CCD. The faster the CCD can be dumped, the shorter the exposure time will be for the subsequent scan.

Figure 16A:
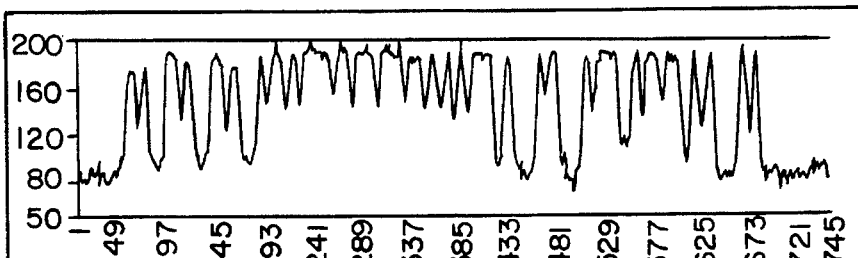
FIGS. 16a, 16b and 16c are pixel values for the incoming signal from the detector, the results of waveshaping that signal according to the second method, and the results of waveshaping the incoming signal according to the first waveshaping method, respectively.
Figure 16B:
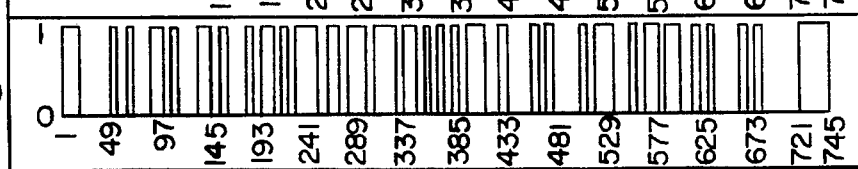
Figure 16C:
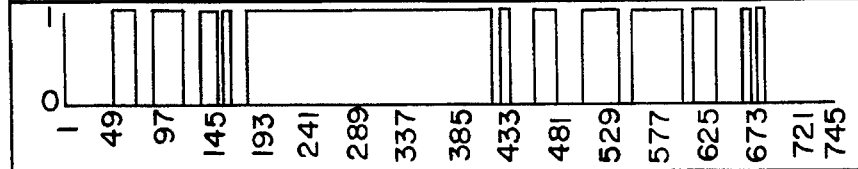

FIGS. 16a, 16b and 16c illustrate the improvement in the output signal using the waveshaping techniques described above compared with the unprocessed signal produced by the detector 20. The pixel values are provided for a scan of a smudged bar code symbol at a distance of approximately 4 inches above the target. The detector clock was set at 74.905 KHz and the negative voltage reference was set at 220 mV. FIG. 16a shows the scan data as provided by the detector without any waveshape processing. FIG. 16b illustrates the significant improvement obtained by using the second waveshaping technique with the sliding frame buffer. FIG. 16c illustrates the improvement over the unprocessed signal obtained by using the first waveshaping technique with the global threshold, which is still lacking considerable detail when compared to the frame buffer technique.

The combination of the optical improvements and the signal processing techniques permits the precise and reliable scanning of high density, fine line bar codes. This combination, in turn, makes the CCD optical scanning head disclosed herein and in the inventor's co-pending applications, even more versatile, with the capability of accurately decoding of bar code symbols at relatively large scanning distances using more economical LED illumination.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. An optical scanning head for scanning and decoding a bar code symbol, said bar code symbol having a bar code axis parallel to a single bar within said bar code symbol, the optical scanning head comprising:

a printed circuit board having a front portion, a rear portion, a left side and a right side;

at least one LED disposed on each of said left side and said right side, said at least one LED oriented to emit light toward said front portion of said printed circuit board;

a diffuser disposed forward of said at least one LED;

a first focusing lens adjacent to said diffuser for focusing light from said LED to create a line of light at said bar code symbol from which at least a portion of said line of light is reflected, said first focusing lens having an entry side and an exit side;

a lens assembly for receiving at least a portion of the reflected light, the reflected light being directed along an optical path within said lens assembly, said lens assembly comprising:

a plurality of lenses disposed within said optical path for focusing reflected light;

a cat's eye aperture disposed within said optical path and having a first long axis and a first short axis, said first long axis being parallel to said bar code axis, said cat's eye aperture being disposed at a focus of said plurality of lenses;

a detector having a plurality of pixels disposed within said optical path behind said lens assembly for detecting the reflected light and generating an electrical signal representative of said bar code symbol therefrom; and a signal processing means for converting said electrical signal into an output representative of said bar code symbol, said signal processing means including a waveshaping algorithm to reduce error at said output, said waveshaping algorithm comparing previous values of pixels and slope transitions of said previous pixel values.

2. An optical scanning head as in claim 1 further comprising an obscuration disposed within said optical path and having a second long axis and a second short axis, said second long axis being disposed perpendicular to said bar code axis.

3. An optical scanning head as in claim 1 wherein said plurality of lenses includes a collection optic and said obscuration is disposed on said collection optic.

4. An optical scanning head as in claim 1 further comprising a diffuser disposed forward of said at least one LED for homogenizing light from said LED.

5. An optical scanning head as in claim 1 further comprising a slit disposed between each said at least one LED and its corresponding diffuser.

6. An optical scanning head as in claim 1 wherein said lens assembly and said detector are disposed within a first dark room on said printed circuit board, said dark room having a top and a bottom.

7. An optical scanning head as in claim 6 wherein a portion of said first dark room between said lens assembly and said detector has a plurality of baffles formed in its top and its bottom.

8. An optical scanning head as in claim 7 wherein said plurality of baffles is disposed so that a portion of said plurality of baffles on said top of said first dark room point downward at an angle toward said lens assembly and a portion of said plurality of baffles on said bottom of said first dark room point upward at an angle toward said lens assembly.

9. An optical scanning head as in claim 6 wherein said at least one LED is disposed within a second dark room.

10. An optical scanning head as in claim 1 further comprising a light absorbing mask framing said detector.

11. An optical scanning head as in claim 1 wherein said diffuser is disposed on said entry side of said first focusing lens.

12. An optical scanning head as in claim 1 wherein said waveshaping algorithm determines a global threshold for the next scan.

13. An optical scanning head as in claim 1 wherein said waveshaping algorithm generates pseudo-pixels.

14. An optical scanning head as in claim 1 wherein said waveshaping algorithm includes a sliding frame buffer.

15. An optical scanning head for scanning and decoding a bar code symbol, said bar code symbol having a bar code axis parallel to a single bar within said bar code symbol, the optical scanning head comprising:

a printed circuit board having a front portion, a rear portion, a left side and a right side;

at least one LED disposed on each of said left side and said right side, said at least one LED oriented to emit light toward said front portion of said printed circuit board;

a first focusing lens forward of said at least one LED for focusing light from said LED to create a line of light at said bar code symbol from which at least a portion of said line of light is reflected, said first focusing lens having an entry side and an exit side;

a lens assembly for receiving at least a portion of the reflected light, the reflected light being directed along an optical path within said lens assembly;

a detector having a plurality of pixels disposed within said optical path behind said lens assembly for detecting the reflected light and generating an electrical signal representative of said bar code symbol therefrom; and a signal processing means for converting said electrical signal into an output representative of said bar code symbol, said signal processing means including a waveshaping algorithm to reduce error at said output, said waveshaping algorithm comparing previous values of pixels and slope transitions of said previous pixel values.

16. An optical scanning head as in claim 15 wherein said waveshaping algorithm determines a global threshold for a subsequent scan.

17. An optical scanning head as in claim 15 wherein said waveshaping algorithm generates pseudo-pixels.

18. An optical scanning head as in claim 15 wherein said waveshaping algorithm includes a sliding frame buffer.

19. An optical scanning head as in claim 15 wherein said signal processing means further includes pre-scan setup software for controlling exposure time of a subsequent scan.

* * * * *